United States Patent
Kocon (10) Patent No.: US 8,125,029 B2
(45) Date of Patent: *Feb. 28, 2012

(54) LATERAL POWER DIODE WITH SELF-BIASING ELECTRODE

(75) Inventor: Christopher Boguslaw Kocon, Mountaintop, PA (US)

(73) Assignee: Fairchild Semiconductor Corporation, South Portland, ME (US)

(*) Notice: Subject to any disclaimer, the term of this patent is extended or adjusted under 35 U.S.C. 154(b) by 45 days.

This patent is subject to a terminal disclaimer.

(21) Appl. No.: 12/344,063

(22) Filed: Dec. 24, 2008

(65) Prior Publication Data

US 2009/0102007 A1    Apr. 23, 2009

Related U.S. Application Data

(63) Continuation of application No. 11/404,062, filed on Apr. 12, 2006, now Pat. No. 7,473,976.

(60) Provisional application No. 60/774,900, filed on Feb. 16, 2006.

(51) Int. Cl.
*H01L 29/66* (2006.01)

(52) U.S. Cl. . 257/341; 257/335; 257/342; 257/E29.256; 257/E29.261

(58) Field of Classification Search .................. 257/513, 257/520, 262, 408, 508, 336, 344, 335, 341–343, 257/E29.261, E29.256

See application file for complete search history.

(56) References Cited

U.S. PATENT DOCUMENTS

| | | | |
|---|---|---|---|
| 5,583,348 A * | 12/1996 | Sundaram | 257/73 |
| 6,097,063 A | 8/2000 | Fujihira | |
| 6,445,019 B2 | 9/2002 | Van Dalen | |
| 6,713,813 B2 | 3/2004 | Marchant | |
| 6,888,195 B2 | 5/2005 | Saito et al. | |
| 7,473,966 B1 * | 1/2009 | Blanchard | 257/342 |
| 7,473,976 B2 | 1/2009 | Kocon | |
| 7,777,278 B2 * | 8/2010 | Hirler et al. | 257/367 |

(Continued)

FOREIGN PATENT DOCUMENTS

WO    2007098317    8/2007

OTHER PUBLICATIONS

PCT, International Search Report of The International Searching Authority for Application No. PCT/US07/61718 Dated Feb. 27, 2008.

(Continued)

*Primary Examiner* — Kenneth Parker
*Assistant Examiner* — Jose R Diaz
(74) *Attorney, Agent, or Firm* — Kilpatrick Townsend & Stockton LLP (57) ABSTRACT

A semiconductor diode includes a drift region of a first conductivity type and an anode region of a second conductivity type in the drift region such that the anode region and the drift region form a pn junction therebetween. A first highly doped silicon region of the first conductivity type extends in the drift region, and is laterally spaced from the anode region such that upon biasing the semiconductor power diode in a conducting state, a current flows laterally between the anode region and the first highly doped silicon region through the drift region. A plurality of trenches extends into the drift region perpendicular to the current flow. Each trench includes a dielectric layer lining at least a portion of the trench sidewalls and also includes at least one conductive.

12 Claims, 8 Drawing Sheets

U.S. PATENT DOCUMENTS

| | | | |
|---|---|---|---|
| 2001/0055845 | A1 | 12/2001 | Arai et al. |
| 2002/0053717 | A1 | 5/2002 | Sumida |
| 2003/0089947 | A1 | 5/2003 | Kawaguchi et al. |
| 2003/0207536 | A1 | 11/2003 | Miyasaka et al. |
| 2004/0245597 | A1* | 12/2004 | Tihanyi .......................... 257/500 |
| 2005/0167742 | A1 | 8/2005 | Challa et al. |
| 2007/0013008 | A1 | 1/2007 | Xu et al. |

OTHER PUBLICATIONS

PCT Written Opinion of The International Searching Authority for Application No. PCT/US07/61718 Dated Feb. 27, 2008.

PCT International Preliminary Report on Patentability for Application No. PCT/US2007/061718 Dated Aug. 28, 2008.

Non-Final Office Action for U.S. Appl. No. 11/404,062 Dated Dec. 14, 2007.

Notice of Allowance for U.S. Appl. No. 11/404,062 Dated May 29, 2008.

Notice of Allowance for U.S. Appl. No. 11/404,062 Dated Sep. 4, 2008.

* cited by examiner

LATERAL POWER DIODE WITH SELF-BIASING ELECTRODE

CROSS-REFERENCES TO RELATED APPLICATIONS

This application is a continuation of U.S. application Ser. No. 11/404,062, filed Apr. 12, 2006, which claims the benefit of U.S. Provisional Application No. 60/774,900, filed Feb. 16, 2006. The prior applications are incorporated herein by reference in their entirety for all purposes.

U.S. application Ser. No. 10/269,126, filed Oct. 3, 2002, and U.S. application Ser. No. 10/951,259, filed Sep. 26, 2004, are also incorporated herein by reference in their entirety for all purposes.

BACKGROUND OF THE INVENTION

Figure 1:
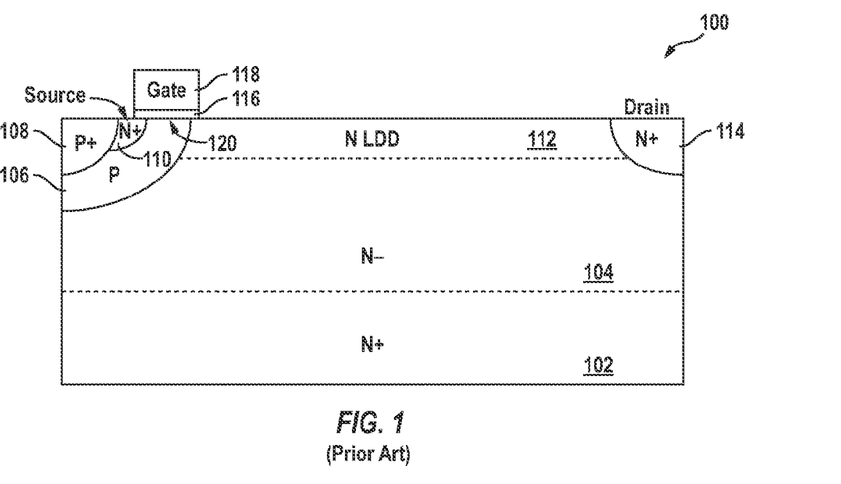
FIG. 1 shows a simplified cross section view of a conventional lateral MOSFET 100.

The present invention relates to semiconductor power devices, and more particularly to lateral power devices with self-biasing electrodes integrated therein. FIG. 1 shows a cross section view of a conventional lateral MOSFET 100. A lightly doped N-type drift region 104 extends over a highly doped N-type region 102. A P-type body region 106 and a highly dope N-type drain region 114 separated from each other by a laterally-extending N-type lightly doped drain (LDD) region are all formed in drift region 104. Highly doped N-type source region 110 is formed in body region 106, and heavy body region 108 is formed in body region 106. A gate 118 extends over a surface of body region 106 and overlaps source region 110 and LDD region 112. Gate 118 is insulated from its underlying regions by a gate insulator 116. The portion of body region 106 directly beneath gate 118 forms the MOSFET channel region 120.

During operation, when MOSFET 100 is biased in the on state, current flows laterally from source region 110 to drain region 114 through channel region 120 and LDD region 112. As with most conventional MOSFETs, performance improvements of lateral MOSFET 100 is limited by the competing goals of achieving higher blocking capability and lower on-resistance (Rdson). While LDD region 112 results in improved Rdson, this improvement is limited by the blocking capability of the transistor. For example, the doping concentration of LDD region 112 and the depth to which it can be extended are both severely limited by the transistor breakdown voltage.

These impediments to performance improvements are also present in other types of lateral power devices such as lateral IGBTs, lateral pn diodes, and lateral Schottky diodes. Thus, there is a need for a technique whereby the blocking capability, the on-resistance, as well as other performance parameters of various types of lateral power devices can be improved.

BRIEF SUMMARY OF THE INVENTION

In accordance with an embodiment of the invention, a semiconductor diode includes a drift region of a first conductivity type and an anode region of a second conductivity type in the drift region such that the anode region and the drift region form a pn junction therebetween. A first highly doped silicon region of the first conductivity type is in the drift region, and is laterally spaced from the anode region such that upon biasing the semiconductor power diode in a conducting state, a current flows laterally between the anode region and the first highly doped silicon region through the drift region. Each of a plurality of trenches extending into the drift region perpendicular to the current flow includes a dielectric layer lining at least a portion of the trench sidewalls and at least one conductive electrode.

In accordance with another embodiment of the invention, a schottky diode includes a drift region of a first conductivity type and a lightly doped silicon region of the first conductivity type in the drift region. A conductor layer extends over and contacts the lightly doped silicon region to form a schottky contact therebetween. A highly doped silicon region of the first conductivity type in the drift region is laterally spaced from the lightly doped silicon region such that upon biasing the schottky diode in a conducting state, a current flows laterally between the lightly doped silicon region and the highly doped silicon region through the drift region. Each of a plurality of trenches extending into the drift region perpendicular to the current flow includes a dielectric layer lining at least a portion of the trench sidewalls and at least one conductive electrode.

In accordance with yet another embodiment of the invention, a semiconductor diode is formed as follows. An anode region is formed in a drift region so as to form a pn junction therebetween. The drift region is of first conductivity type, and the anode region is of a second conductivity type. A first highly doped silicon region of the first conductivity type is formed in the drift region. The first highly doped silicon region is laterally spaced from the anode region such that upon biasing the semiconductor power diode in a conducting state, a current flows laterally between the anode region and the first highly doped silicon region through the drift region.

In accordance with still another embodiment of the invention, a schottky diode is formed as follows. A lightly doped silicon region of a first conductivity type is formed in a drift region of the first conductivity type. A conductor layer is formed extending over and in contact with the lightly doped silicon region so as to form a schottky contact therebetween. A highly doped silicon region of the first conductivity type is formed in the drift region. The highly doped silicon region is laterally spaced from the lightly doped silicon region such that upon biasing the schottky diode in a conducting state, a current flows laterally between the lightly doped silicon region and the highly doped silicon region through the drift region. A plurality of trenches extending into the drift region perpendicular to the current flow is formed. A dielectric layer lining at least a portion of the trench sidewalls is formed. At least one conductive electrode is formed in each trench.

DETAILED DESCRIPTION OF THE INVENTION

In accordance with the invention, self-biasing electrodes are integrated in various lateral power devices such that the electric filed distribution in the blocking layer of these devices is altered so as to improve the device blocking capability for the same doping concentration of the blocking layer. Alternatively, the self-biasing electrodes enable use of higher doping concentration in the blocking layer for the same blocking capability, whereby the device on-resistance and power consumption are improved.

Figure 2:
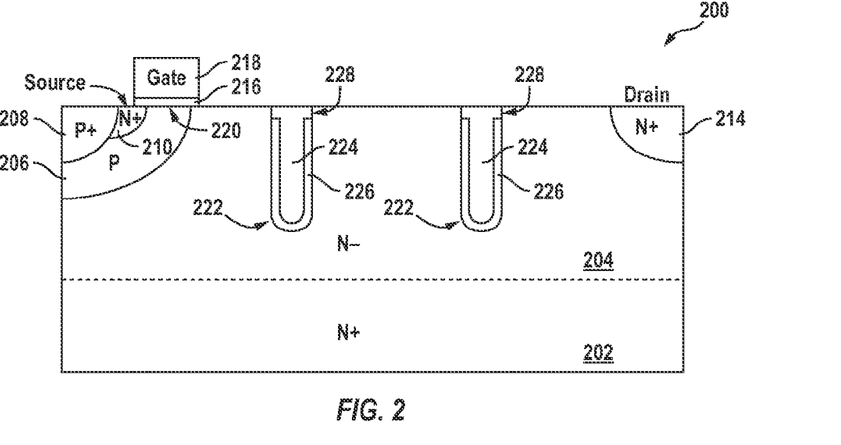
FIGS. 2 and 3 show simplified cross section views of lateral MOSFET structures with two different self-biasing electrode structures integrated therein, in accordance with exemplary embodiments of the invention.

FIG. 2 shows a simplified cross section view of a planar-gate lateral MOSFET 200 with self-biasing electrodes, in accordance with an exemplary embodiment of the invention. A lightly doped N-type drift region 204 extends over a highly doped N-type semiconductor region 202. In one embodiment, both drift region 204 and its underlying highly doped semiconductor region 202 are epitaxial layers. In another embodiment, drift region 204 is an epitaxial layer and highly doped semiconductor region 202 is an N+ substrate. In yet another embodiment, drift region 204 is formed by implanting and driving dopants into highly doped region 202 which itself can be an epitaxial layer or a substrate.

A P-type body region 206 and a highly dope N-type drain region 214 are located in an upper portion of drift region 204. Body region 206 and drain region 214 are laterally spaced from one another as shown. Highly doped N-type source region 210 is located in an upper part of body region 206, and heavy body contact region 208 is located in body region 206 adjacent source region 210. A gate 218 extends over a surface of body region 206 and overlaps source region 210 and drift region 204. Gate 218 is insulated from its underlying regions by a gate insulator 216. The portion of body region 206 directly beneath gate 218 forms the MOSFET channel region 220. A source conductor (not shown) electrically contacts source region 210 and heavy body region 208, and a drain conductor (also not shown) electrically contacts drain region 214. The source and drain conductors may be from metal.

Trenches 222 extend in drift region 204 to a predetermined depth. An insulating layer 226 lines the trench bottom and the trench sidewalls except for upper sidewall portions 228. A T-shaped conductive electrode 224 fills each trench 222 and electrically contacts drift region 204 along the upper trench sidewall portions 228, as shown. In one embodiment, conductive electrode 224 is of opposite conductivity to that of drift region 204, and is thus P-type given the N-type conductivity of drift region 204. In another embodiment, conductive electrode 224 comprises one of highly doped P-type polysilicon, doped silicon and metal.

The presence of dielectric layer 226 advantageously eliminates the need for careful control of the doping of electrode 224 which would otherwise be required to ensure charge balance. Also, in the embodiment wherein electrode 224 comprises doped silicon, dielectric layer 226 prevents the dopants in the doped silicon from out-diffusing.

A method of manufacturing MOSFET 200, in accordance with an embodiment of the invention, is as follows. Gate dielectric 216 and gate electrode 218 are formed over drift region 204 using conventional techniques. Body region 206, source region 210, drain region 214 and heavy body region 208 are formed in drift region 204 using conventional masking and implant/drive-in techniques. Note that source region 210 and body region 208 are self-aligned to the edge of gate electrode 218. The various metal layers (e.g., source and drain metal layers) and dielectric layers not shown are formed using known techniques. Trenches 222 are formed in drift region 204 using conventional masking and silicon etch techniques. A dielectric layer 226 is then formed to line the trench sidewalls and bottom. In one embodiment, dielectric layer 226 has a thickness in the range of 100-500 Å. One factor in determining the thickness of dielectric layer 226 is the doping concentration of drift region 204. For a drift region with higher doping concentration, a thinner dielectric layer 226 may be used.

A layer of polysilicon is then deposited and etched back such that trenches 222 are filled with polysilicon having a top surface that is coplanar with the adjacent mesa surfaces. The polysilicon in each trench is slightly recessed so that portions of dielectric layer 226 along upper trench sidewalls are exposed. The exposed portions of layer 226 are the removed so that drift region 204 along the upper trench sidewalls becomes exposed. A second polysilicon deposition and etch back is carried out to fill the upper portion of each trench, thereby electrically shorting the polysilicon electrode in each trench to the drift region.

The process steps for forming the self-biasing electrodes may be carried out at various stages of the process depending on the manufacturing technology, the material used for various layers and other process and design constraints. For example, if electrodes 224 comprise polysilicon, the steps for forming the trenched electrodes may be carried out early in the process since polysilicon can withstand high temperatures. However, if electrodes 224 comprise metal, then the steps for forming the trenched electrodes need to be carried out later in the manufacturing process after the high temperature processes have been carried out.

Figure 3:
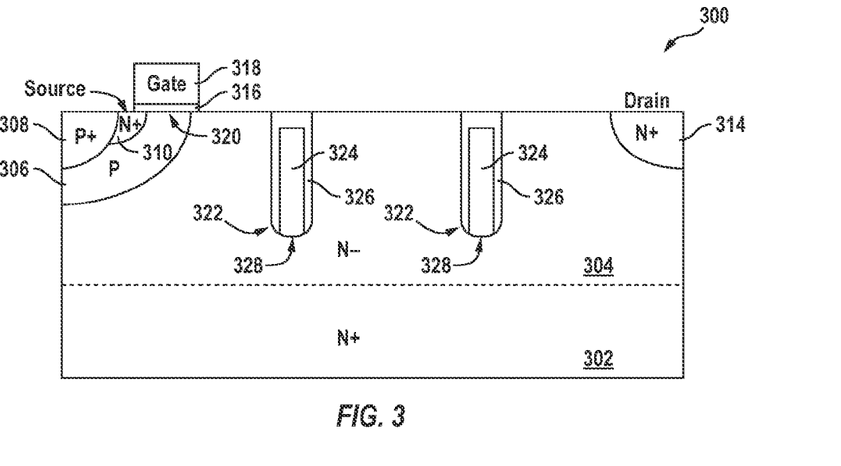

FIG. 3 shows an alternate self-biasing electrode structure/technique integrated with a MOSFET 300, in accordance with another exemplary embodiment of the invention. In FIG. 3, electrodes 324 in trenches 322 make electrical contact with drift region 304 along the bottom region 328 of trenches 322 rather than along the top of the trenches as in MOSFET 200. The manufacturing process for forming MOSFET 300 is similar to that for MOSFET 200 described above except for the process steps associated with forming the trenched electrode structure which is described next.

Trenches 322 are formed in drift region 304 using conventional masking and silicon etch techniques. Although trenches 322 may be further extended to terminate in the highly doped region 302, terminating trenches 322 in drift region 304 is more advantageous since the lower doping of drift region 304 facilitates the self-biasing of electrodes 324. This is described in more detail further below. Next, a dielectric layer 326 lining the trench sidewalls and bottom is formed using conventional techniques. Next, a directional etch of dielectric layer 326 removes only the horizontally extending portions of dielectric layer 326. Drift region 304 thus becomes exposed along the bottom region 328 of trenches 322. A conductive electrode, such as in-situ doped (P-type) polysilicon is formed and then recessed into trenches 322. Another dielectric layer is then formed over electrodes 324 to seal off trenches 322. Electrodes 328 are thus in electrical contact with drift region 304 along the trench bottom regions 328.

The electrical connection between P-type electrodes 224 and N-type drift region 204 in MOSFET 200, and between P-type electrodes 324 and N-type drift region 304 in MOSFET 300 result in electrodes 224 and 324 self-biasing to a voltage greater than zero. In one embodiment, the doping polarity of all regions in MOSFETs 200 and 300 are reversed thus forming P-channel MOSFETs. In this embodiment, the electrical connection between the P-type drift region and the N-type trenched electrodes result in the electrodes self-biasing to a voltage less than zero.

Figure 4:
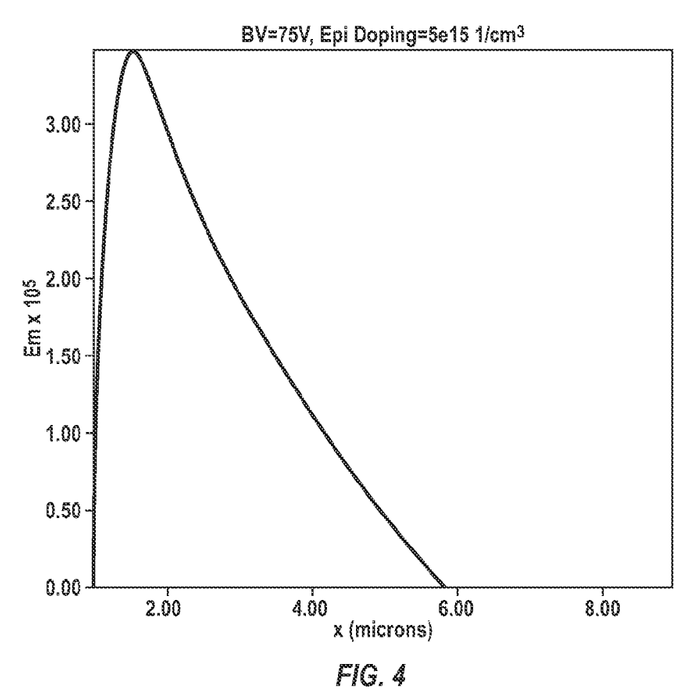
FIGS. 4 and 5 are simulation results respectively showing the electric field distribution in the drift region for the conventional MOSFET in FIG. 1 and the exemplary MOSFET embodiment shown in FIG. 3.
Figure 5:
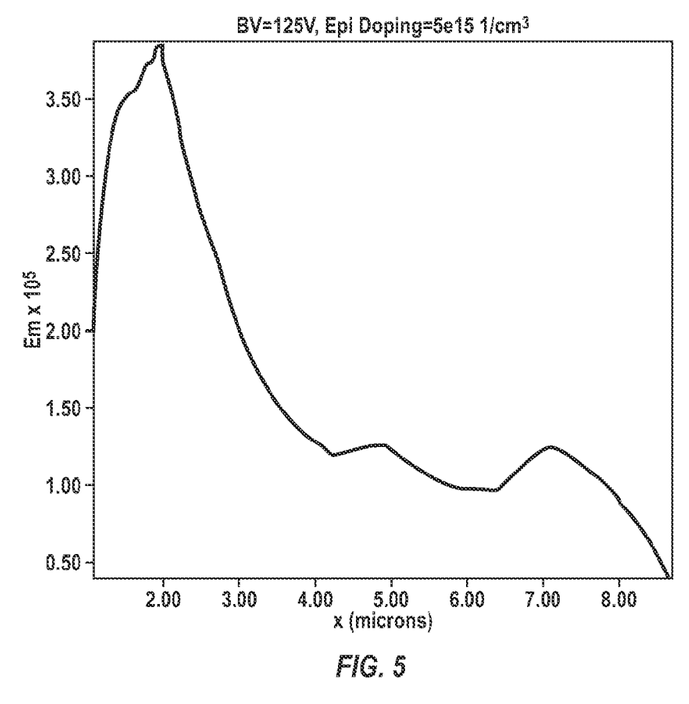

The self-biasing electrodes serve to alter the electric field in the drift region as illustrated by the simulation results in FIGS. 4 and 5. FIG. 4 shows the electric field distribution in drift region 104 of the conventional MOSFET 100 in FIG. 1.

As can be seen, the electric field peaks near the curvature of body region 106, and then tapers off towards the drain region thus forming a triangular area under the electric field curve. FIG. 5 shows the electric field distribution in drift region 304 of MOSFET 300 in FIG. 3. As can be seen, other than the peak at the curvature of body region 306, two additional peaks are induced by the two self-biasing electrodes 324. As a result, the area under the electric field curve is increased which in turn increases the transistor breakdown voltage. As indicated in FIGS. 4 and 5, the breakdown voltage is improved from 75V for the prior art MOSFET 100 to 125V for MOSFET 300 for the same drift region doping concentration of $5 \times 10^{15}/cm^3$. This amounts to a 66% improvement in the breakdown voltage.

Figure 6:
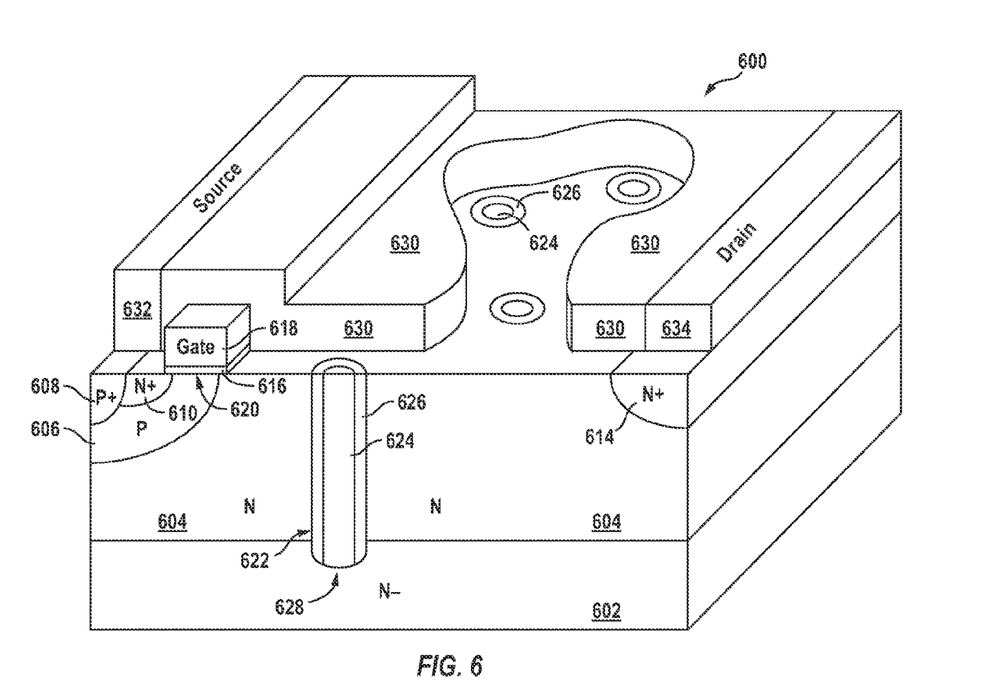
FIGS. 6-16 show simplified isometric views of various lateral power device structures with self-biasing electrode structures integrated therein, in accordance with other exemplary embodiments of the invention.

FIG. 6 shows a simplified isometric view of a MOSFET 600 wherein various layers are peeled back to reveal the underlying regions, in accordance with an embodiment of the invention. MOSFET 600 is similar to MOSFET 300 except for few features that are described further below. The FIG. 6 isometric view shows one of many possible placement patterns for the self-biasing electrodes in drift region 604. As can be seen, the self-biasing electrodes are arranged in a staggered configuration, but many other configurations can also be envisioned by one skilled in this art. In one embodiment, the location and number of electrodes is to some extent dependent on the doping concentration of drift region 604. The higher the doping concentration of drift region 604, the more electrodes can be placed in the drift region and thus a higher breakdown voltage is obtained. Also, the number of electrodes may be limited by the current density requirements of the device.

In an alternate embodiment, an LDD region similar to LDD region 112 in the conventional MOSFET 100 is incorporated in MOSFET 600. Such LDD region would have a higher doping concentration than drift region 604 in which it is formed, and thus allows a higher number of self-biasing electrodes be included in the drift region if desired. The LDD region together with the increased number of self-biasing electrodes significantly reduces the device on-resistance and increase the breakdown voltage.

FIG. 6 also shows a source conductor 632 (e.g., comprising metal) electrically contacting source region 610 and heavy body region 608, and a drain conductor 634 (e.g., comprising metal) electrically contacting drain region 614, with dielectric layer 630 insulating source conductor 632, gate 618 and drain conductor 634 from one another. As shown, trenched electrodes 624 terminate at the upper surface of drift region 604 so that dielectric layer 630 fully covers electrodes 624. In anther embodiment, electrodes 624 are recessed in their respective trenches similar to electrodes 324 in MOSFET 300.

MOSFET 600 differs from MOSFET 300 in a number of respects. Drift region 604 is higher doped than drift region 304 in FIG. 3, and extends over a lower doped silicon region 602 rather than a higher doped silicon region as in MOSFET 300. The higher doping of drift region 604 results in lower conduction resistance through the drift region, and thus a lower on-resistance. The higher doping concentration of the drift region is made possible by the improved blocking capability brought about by the self-biasing electrodes.

Another distinction between MOSFETs 600 and 300 is that in MOSFET 600 trenched electrodes 624 extend clear through drift region 604 and terminate in lower doped silicon region 602. This results in electrodes 624 coming in contact with lower doped silicon region 602 instead of drift region 604. This is advantageous in that by contacting the lower doped region 602 (as opposed to the higher doped drift region 604), electrodes 624 can self-bias rather than attain the potential of the silicon region which would be the case if they contacted higher doped silicon regions.

Figure 7:
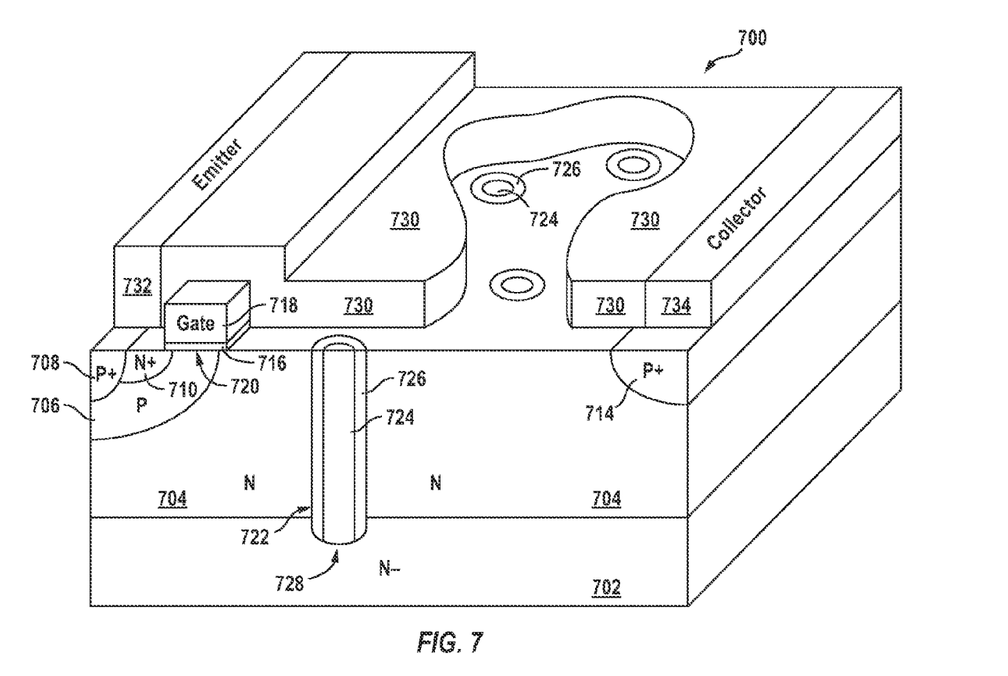

FIG. 7 shows a simplified isometric view of a lateral insulated gate bipolar transistor (IGBT) 700 with integrated self-biasing electrodes, in accordance with an exemplary embodiment of the invention. An N-type drift region 704 extends over a lightly doped N-type region 702. In one embodiment, both drift region 704 and the lightly doped region 702 are epitaxial layers. In another embodiment, drift region 704 is an epitaxial layer and lightly doped region 702 is an N− substrate. In yet another embodiment, drift region 704 is formed by implanting and driving dopants into lightly doped region 702 which itself can be an epitaxial layer or a substrate.

A P-type body region 706 and a highly dope P-type collector region 714 are located in an upper portion of drift region 704. Body region 706 and collector region 714 are laterally spaced from one another as shown. Highly doped N-type emitter region 710 is formed in body region 706, and heavy body contact region 708 is formed in body region 706. A gate 718 (e.g., comprising polysilicon) extends over a surface of body region 706 and overlaps emitter region 710 and drift region 704. Gate 718 is insulated from its underlying regions by a gate insulator 716. The portion of body region 706 directly beneath gate 718 forms the IGBT channel region 720. An emitter conductor 732 (e.g., comprising metal) electrically contacts emitter region 710 and heavy body region 708, and a collector conductor 734 electrically contacts collector region 714. Dielectric layer 730 insulates emitter conductor 732, gate 718 and drain conductor 734 from one another.

Trenches 722 extend through drift region 704 and terminate in silicon region 702. An insulating layer 726 lines the trench sidewalls but not the trench bottom. A conductive electrode 724 fills each trench 722 and electrically contacts silicon region 702 along the trench bottom region 728. In one embodiment, conductive electrode 724 is of opposite conductivity to that of silicon region 702, and is thus P-type given the N-type conductivity of silicon region 702. In another embodiment, conductive electrode 724 comprises a highly doped P-type polysilicon or doped silicon or metal.

Many of the considerations referred to in connection with the preceding embodiments, such as placement and frequency of the electrodes versus the doping concentration of the drift region also apply to IGBT 700 though operational differences (e.g., both hole current and electron current contribute to current conduction in IGBTs) need to be taken into account.

Figure 8:
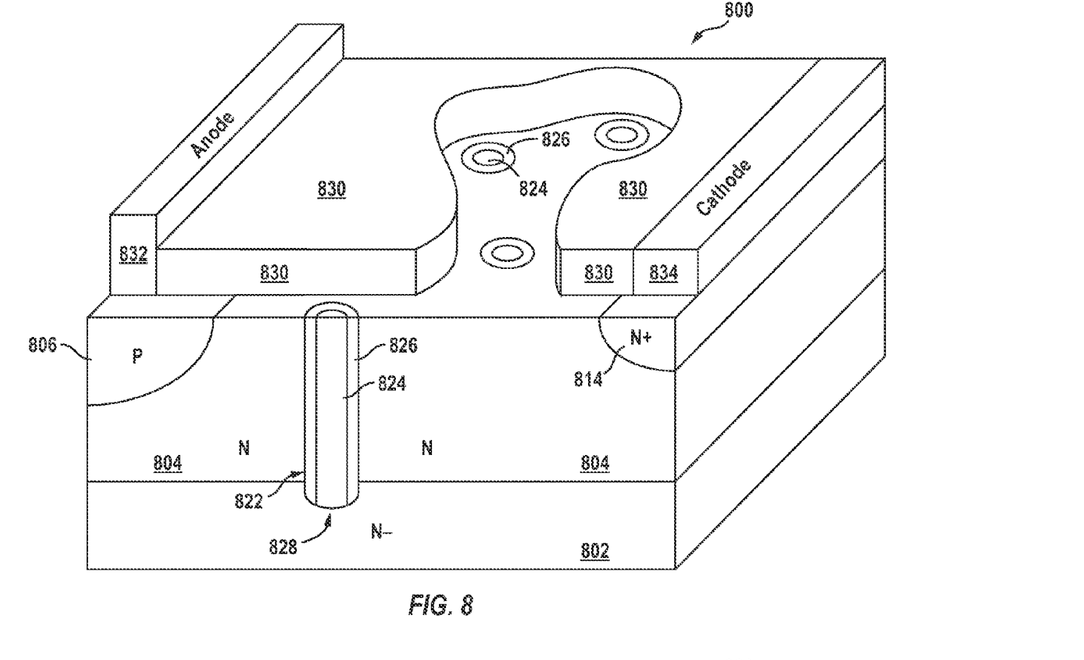

FIG. 8 shows a simplified isometric view of a lateral diode 800 with integrated self-biasing electrodes, in accordance with another exemplary embodiment of the invention. An N-type drift region 804 extends over a lightly doped N-type region 802. As in previous embodiments, silicon region 802 may be an epitaxial layer or a substrate, and drift region 804 may be an epitaxial layer or may be formed by implanting and driving dopants into silicon region 802.

A P-type anode region 806 and a highly doped N-type (N+) region 814 are formed in drift region 804. Anode region 806 and N+ region 814 are laterally spaced from one another as shown. An anode conductor layer 832 (e.g., comprising metal) electrically contacts anode region 806, and a cathode conductor layer 834 (e.g., comprising metal) electrically contacts N+ region 814. Dielectric layer 830 insulates anode conductor layer 832 and cathode conductor layer 834 from one another. Trenched electrodes 824 have similar structure to those in FIGS. 6 and 7, and thus will not be described. As in the previous embodiments, self-biasing electrodes 824 serve to improve the blocking capability of diode 800 for the same drift region doping concentration.

Figure 9:
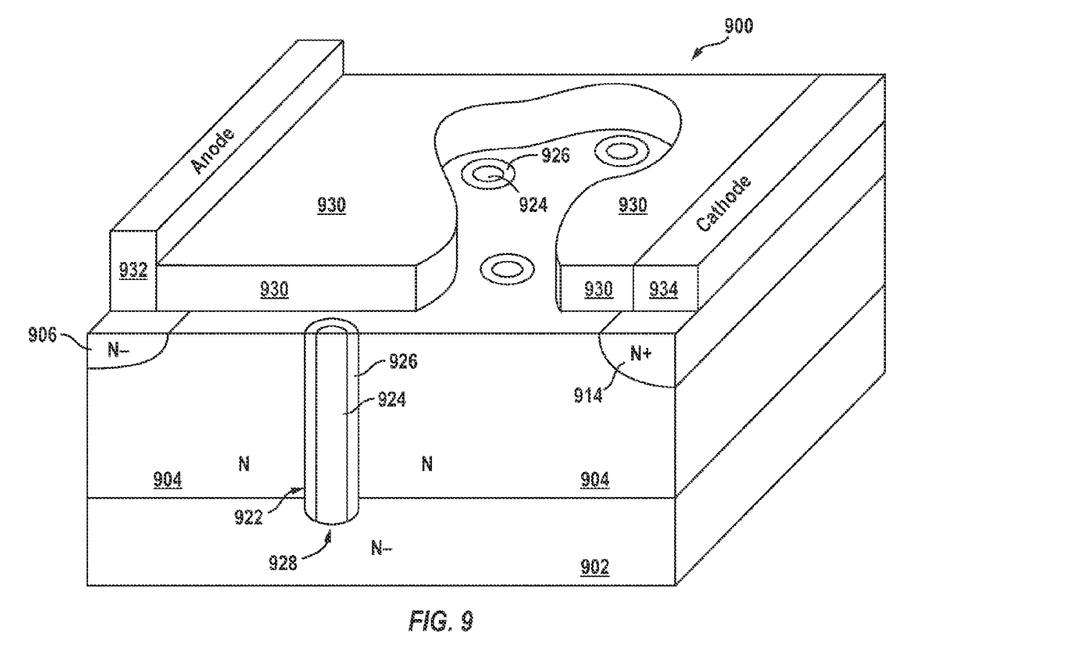

FIG. 9 shows a simplified isometric view of a lateral schottky diode 900 with integrated self-biasing electrodes, in accordance with another exemplary embodiment of the invention. The structure of lateral schottky diode 900 is, for the most part, similar to diode 800; however, instead of P-type anode region 806, a shallow lightly doped N-type region 906 is formed in drift region 904. Anode conductor 932 (e.g., comprising a schottky barrier metal) forms a schottky contact with the shallow N-type region 906. In one variation, a shallow P-type region is formed in place of N-type region 906, whereby anode conductor 932 forms a schottky contact with the P-type region. As in the previous embodiments, self-biasing electrodes 924 serve to improve the blocking capability of schottky diode 900 for the same drift region doping concentration.

Figure 10:
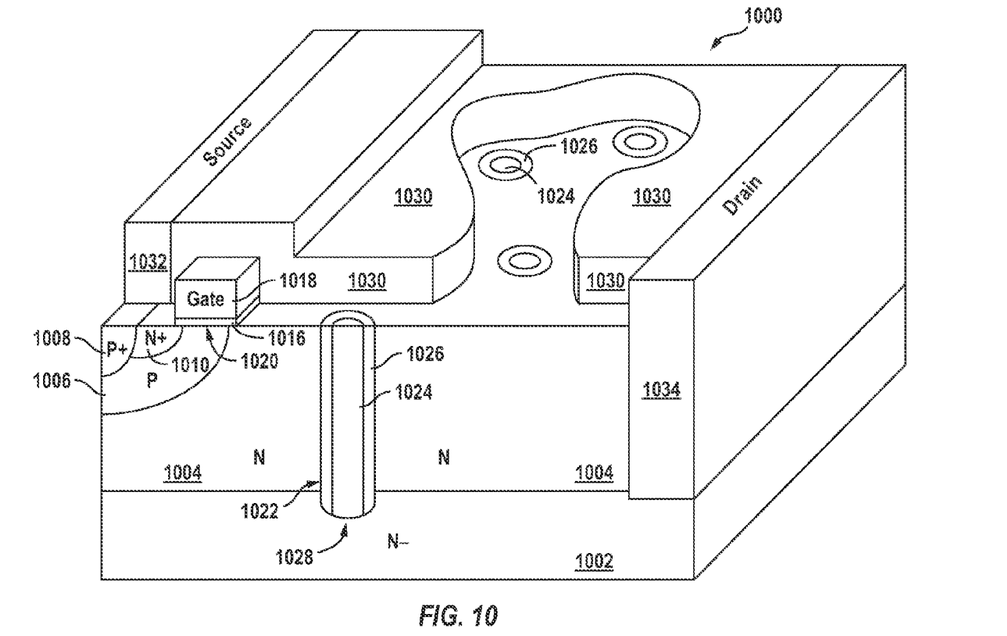

FIG. 10 shows a simplified isometric view of a variation of the lateral MOSFET 600 wherein a drain plug 1034 (e.g., comprising metal) extends deep into drift region 1004. In one embodiment, drain plug 1034 extends to approximately the same depth as electrode trenches 1022. This embodiment is advantageous in that drain plug 1034 serves to spread the current through drift region 1004 thereby further reducing the MOSFET on-resistance. This coupled with the self-biasing electrodes significantly reduce the transistor on-resistance and power consumption.

Figure 11:
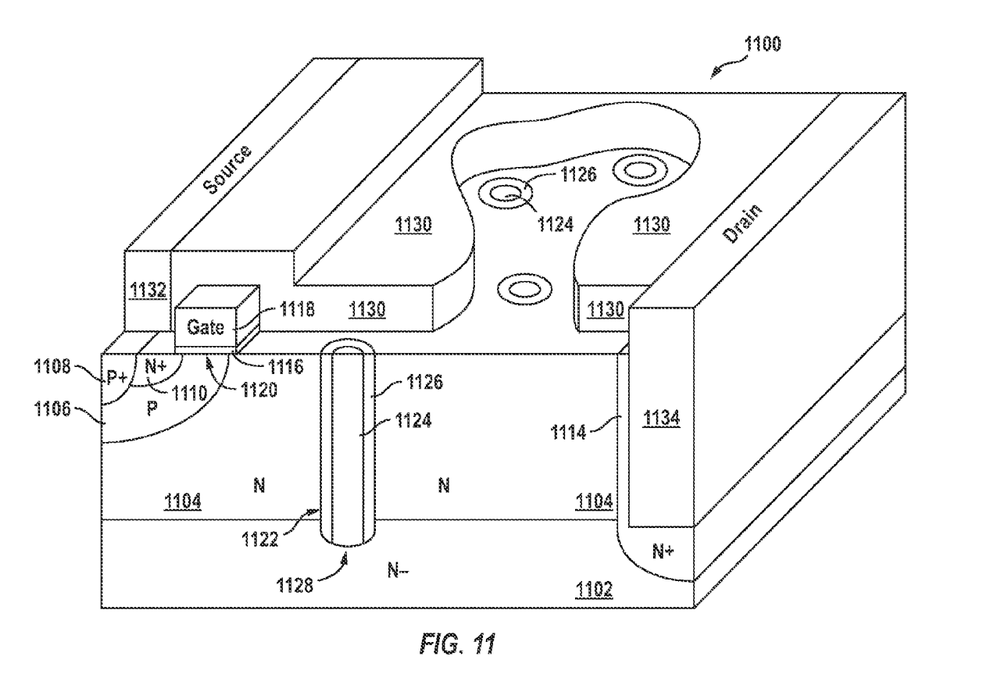

FIG. 11 shows a simplified isometric view of a variation of the lateral MOSFET 1000 wherein in addition to a drain plug 1134, a highly doped N-type drain region 1114 surrounding the drain plug 1134 is incorporated in the structure. Drain region 1114 further reduces the resistance in the transistor current path and reduces the contact resistance of the drain plug. Drain region 1114 can be formed by forming a trench and then carrying out a two-pass angled implant of N-type impurities before filling the trench with a the drain plug, e.g., metal.

Figure 12:
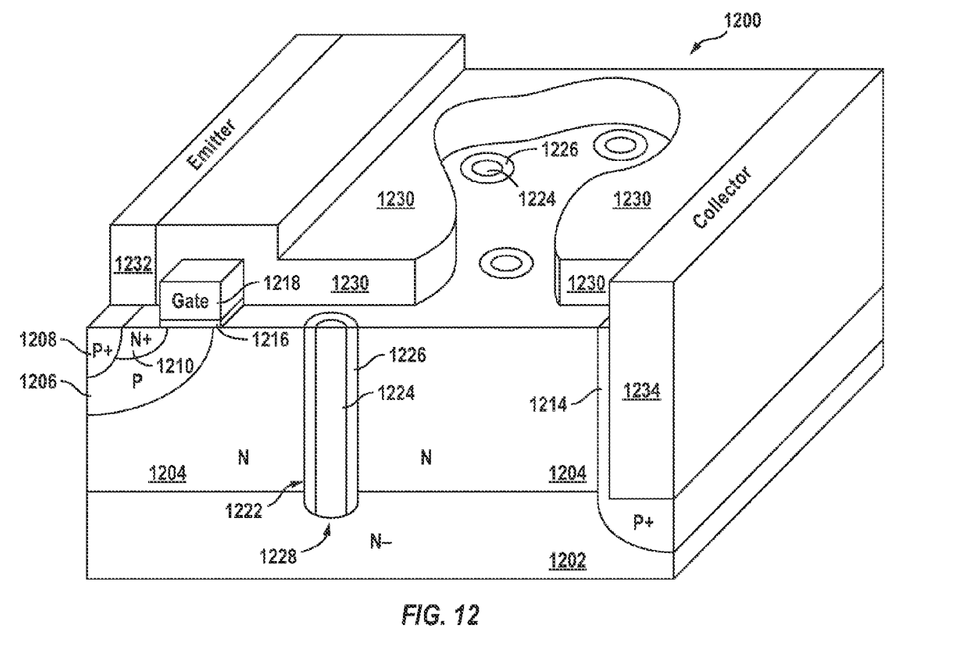
Figure 13:
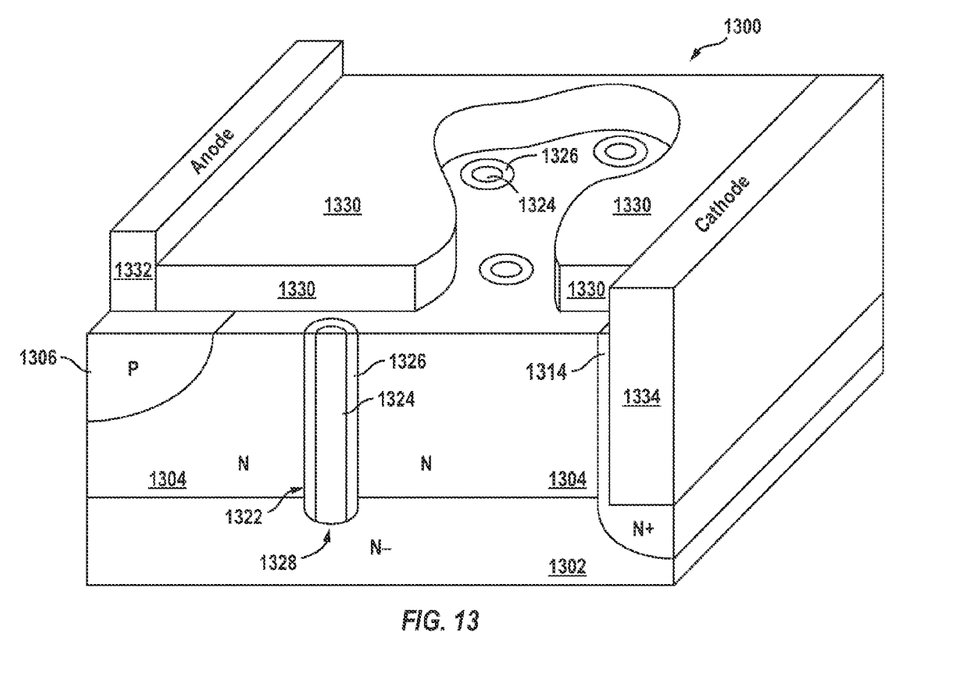

FIG. 12 shows the implementation of a highly conductive plug 1234 (e.g., metal) and an optional highly doped P-type collector region 1214 at the collector terminal of an IGBT 1200 which is otherwise similar in structure to IGBT 700 in FIG. 7, in accordance with another exemplary embodiment of the invention. FIG. 13 shows the implementation of a highly conductive plug 1334 (e.g., metal) and a highly doped N-type region 1214 at the cathode terminal of a lateral diode 1300 which is otherwise similar in structure to the lateral diode 800 in FIG. 8, in accordance with yet another exemplary embodiment of the invention. As in the preceding embodiments, plug 1334 and N+ region 1314 help improve the diode on-resistance. The highly conductive plug may also be implemented in the schottky diode 900 in a similar manner to that shown in FIG. 1300.

FIGS. 6-13 show a higher doped n-type layer (e.g., layer 604 in FIG. 6) over a lower doped n-type layer (e.g., layer 602 in FIG. 6). In one variation of these structures, each of these two layers is epitaxially formed over a highly doped substrate. In another variation, the higher doped n-type layer is an epitaxial layer, and the underlying lower doped n-type layer may be a substrate. In yet another variation, the higher doped n-type layer is formed by implanting and driving n-type dopants into the lightly doped n-type layer which itself can be an epitaxial layer extending over a substrate or a substrate.

Figure 14:
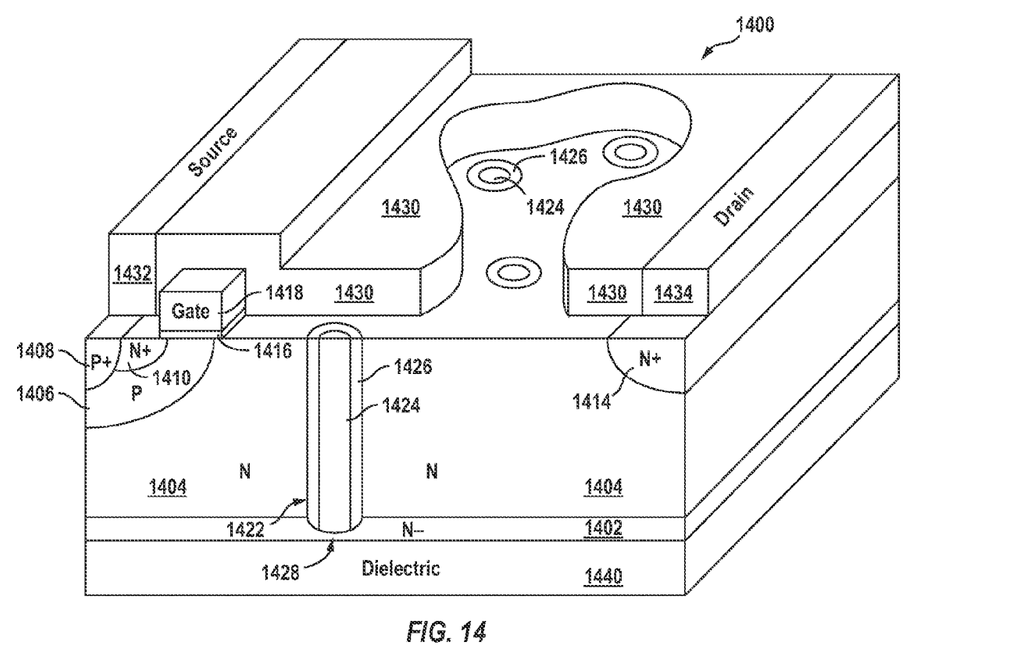

FIG. 14 shows an implementation of the self-biasing electrodes in MOSFET 1400 using silicon on insulator (SOI) technology or buried dielectric technology. As shown, MOSFET 1400 is similar to that in FIG. 6 except that the structure is formed over a dielectric layer 1440 (e.g., comprising oxide). In one embodiment, silicon regions 1402 and 1404 are epitaxial layers sequentially formed over dielectric layer 1440. In another embodiment, drift region 1404 is formed by implanting and driving dopants into epitaxially formed silicon region 1402. Where dielectric layer 1440 is a buried dielectric, a conventional semiconductor substrate (not shown) underlies dielectric layer 1440. Implementation of the other lateral power devices disclosed herein (including lateral IGBT, lateral diode, and lateral schottky diode) using SOI or buried dielectric would be obvious to one skilled in the art in view of this disclosure.

Figure 15:
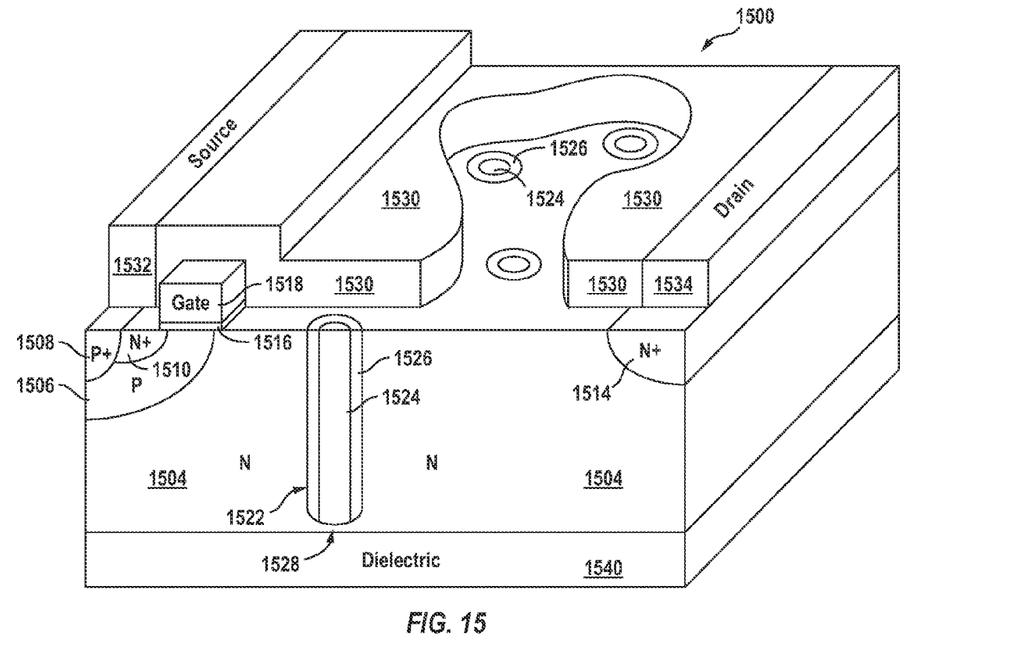
Figure 16:
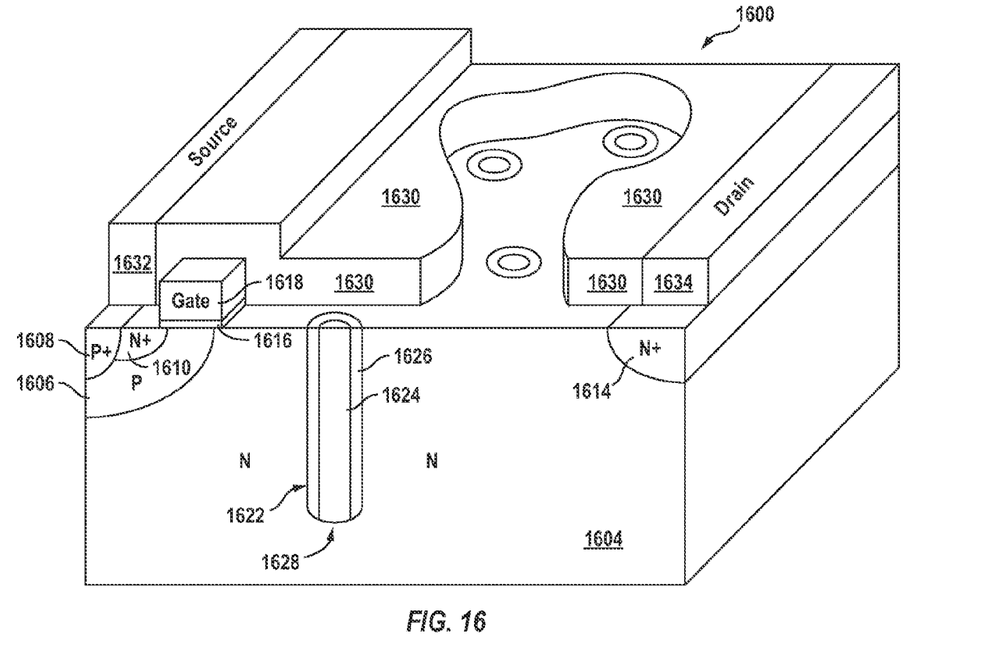

FIG. 15 shows a variation of the FIG. 14 MOSFET wherein the lightly doped silicon region 1402 in MOSFET 1400 is eliminated so that electrode 1424 terminates in and electrically contacts drift region 1504. FIG. 16 shows yet another variation wherein MOSFET 1600 is formed in a single layer of silicon 1604. Implementation of the other lateral devices with integrated self-biasing electrodes in a manner similar to the embodiments shown in FIGS. 15 and 16 would be obvious to one skilled in the art in view of this disclosure.

Figure 17A:
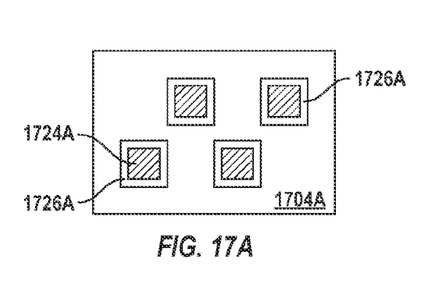
FIGS. 17A-17C show top layout views of three exemplary configurations of the self-biasing electrodes, in accordance with embodiments of the invention.
Figure 17B:
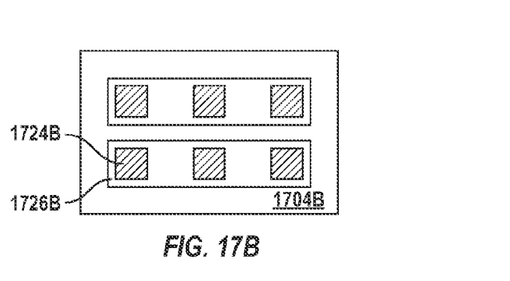
Figure 17C:
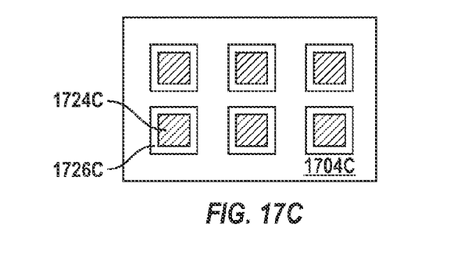

FIGS. 17A-17C show top layout views of three exemplary configurations of the self-biasing electrodes. In FIG. 17A, each electrode 1724A is insulated from drift region 1704A by a dielectric layer 1726A. The electrodes in FIG. 17A are arranged in a staggered configuration similar to those in FIGS. 6-16. In FIG. 17B, a number of electrodes 1724B are placed in a dielectric well 1726B extending along a row. FIG. 17C also shows electrodes 1724C arranged along rows, but each electrode is locally insulated from drift region 1704C by a dielectric layer 1726C. While the electrodes in FIGS. 17A-17C are square-shaped, they may alternatively have many other shapes such as circular, hexagonal and oval.

Note that an LDD region may be incorporate in one or more of the various embodiments disclosed herein in a similar manner to that described above in connection with FIG. 6. Also, while FIGS. 6-16 show the trenched electrodes terminating at the upper surface of the drift region, in other embodiments of the lateral devices in FIGS. 6-16, the trenched electrodes are recessed in their respective trenches similar to electrodes 324 in MOSFET 300.

The various lateral power MOSFET and IGBT embodiments shown and described herein have planar gate structures, however implementing the self-biasing electrodes in lateral MOSFETs and IGBTs with trench gate structures such as those disclosed in U.S. patent application Ser. No. 10/269,126, filed Oct. 3, 2002, which disclosure is incorporated herein by reference in its entirety, would be obvious to one skilled in this art in view this disclosure. Similarly, implementing the self-biasing electrodes in lateral MOSFETs and IGBTs with shielded gate structures such as those disclosed in U.S. patent application Ser. No. 10/951,259, filed Sep. 26, 2004, which disclosure is incorporated herein by reference in its entirety, would be obvious to one skilled in this art in view of this disclosure.

While the above provides a detailed description of various embodiments of the invention, many alternatives, modifications, combinations and equivalents of these embodiments are possible. For example, while the exemplary lateral power device embodiments in FIGS. 6-16 incorporate self-biasing electrodes which make contact with an adjacent silicon region along the bottom of the electrodes, modifying these lateral power device embodiments or their obvious variants so that the electrodes make contact to adjacent silicon region along their top (similar to that shown in FIG. 2) would be obvious to one skilled in this art in view of this disclosure. Also, it is to be understood that all material types provided herein to describe various dimensions, doping concentrations, and different semiconducting or insulating layers are for illustrative purposes only and not intended to be limiting. For example, the doping polarity of various silicon region and the self-biasing electrodes in the embodiments described herein may be reversed to obtain the opposite polarity type device of the particular embodiment. For these and other reasons, therefore, the above description should not be taken as limiting the scope of the invention, which is defined by the appended claims.

What is claimed is:

1. A semiconductor diode comprising:
   a drift region of a first conductivity type;
   an anode region of a second conductivity type in the drift region, the anode region and the drift region forming a pn junction therebetween;
   a first highly doped silicon region of the first conductivity type in the drift region, the first highly doped silicon region being laterally spaced from the anode region such that upon biasing the semiconductor diode in a conducting state, a current flows laterally between the anode region and the first highly doped silicon region through the drift region; and
   a plurality of trenches extending into the drift region perpendicular to the current flow, each trench having a dielectric layer lining at least a portion of the trench sidewalls and at least one conductive electrode, wherein each conductive electrode electrically contacts the drift region along upper sidewalls of each trench.

2. The semiconductor diode of claim 1 wherein the drift region extends over a second silicon region of the first conductivity type, the second silicon region having a higher doping concentration than the drift region.

3. The semiconductor diode of claim 1 wherein the drift region extends over a second dielectric layer.

4. The semiconductor diode of claim 1 wherein each conductive electrode is of a second conductivity type.

5. The semiconductor diode of claim 1 wherein the plurality of trenches are located between the anode region and the first highly doped silicon region in a staggered configuration.

6. The semiconductor diode of claim 1 further comprising a highly conductive plug extending into the first highly doped silicon region.

7. The semiconductor diode of claim 6 wherein the highly conductive plug and the plurality of trenches extend to substantially the same depth.

8. The semiconductor diode of claim 1 wherein the drift region extends over a second silicon region of the first conductivity type, the second silicon region having a lower doping concentration than the drift region.

9. A method of forming a semiconductor diode comprising:
   forming an anode region in a drift region of a first conductivity type, the anode region being of a second conductivity type, the anode region and the drift region forming a pn junction therebetween;
   forming a first highly doped silicon region of the first conductivity type in the drift region, the first highly doped silicon region being laterally spaced from the anode region such that upon biasing the semiconductor diode in a conducting state, a current flows laterally between the anode region and the first highly doped silicon region through the drift region;
   forming a plurality of trenches extending into the drift region perpendicular to the current flow;
   forming a dielectric layer lining at least a portion of each trench sidewalls; and
   forming at least one conductive electrode in each trench, wherein the dielectric layer is formed such that each conductive electrode electrically contacts the drift region along upper sidewalls of each trench.

10. The method of claim 9 further comprising forming the drift region of the first conductivity type over a substrate of the first conductivity type, the substrate having a higher doping concentration than the drift region.

11. The method of claim 9 wherein the step of forming at least one conductive electrode comprises forming a polysilicon layer filling the plurality of trenches, the polysilicon layer being in-situ doped to have a second conductivity type.

12. The method of claim 9 further comprising forming the drift region of the first conductivity type over a substrate of the first conductivity type, the substrate having a lower doping concentration than the drift region.

* * * * *